United States Patent
Watanabe

(10) Patent No.: US 10,319,682 B2
(45) Date of Patent: Jun. 11, 2019

(54) ELECTRONIC COMPONENT DEVICE, METHOD OF MOUNTING ELECTRONIC COMPONENT DEVICE ON CIRCUIT BOARD, AND MOUNTING STRUCTURE OF ELECTRONIC COMPONENT DEVICE ON CIRCUIT BOARD

(71) Applicant: Murata Manufacturing Co., Ltd., Nagaokakyo-shi, Kyoto-fu (JP)

(72) Inventor: Kazushi Watanabe, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/613,327

(22) Filed: Jun. 5, 2017

(65) Prior Publication Data

US 2018/0005950 A1 Jan. 4, 2018

(30) Foreign Application Priority Data

Jun. 29, 2016 (JP) ................ 2016-129365

(51) Int. Cl.
*H01L 29/18* (2006.01)
*H01L 23/538* (2006.01)
(Continued)

(52) U.S. Cl.
CPC ...... *H01L 23/5389* (2013.01); *H01L 23/3107* (2013.01); *H01L 23/3121* (2013.01); *H01L 23/525* (2013.01); *H05K 1/184* (2013.01); *H05K 3/301* (2013.01); *H05K 3/3405* (2013.01); *H05K 3/3436* (2013.01); *H05K 3/3447* (2013.01); *H05K 7/1053* (2013.01);
(Continued)

(58) Field of Classification Search
CPC ............ H01L 23/5289; H01L 23/3107; H01L 23/525; H05K 7/20463; H05K 3/4682
See application file for complete search history.

(56) References Cited

U.S. PATENT DOCUMENTS

| 2001/0009342 A1 | 7/2001 | Furukawa et al. |
| 2008/0253102 A1 | 10/2008 | Kuroda |
(Continued)

FOREIGN PATENT DOCUMENTS

| JP | 2001-274290 A | 10/2001 |
| JP | 2007-201217 A | 8/2007 |
(Continued)

OTHER PUBLICATIONS

Official Communication issued in Japanese Patent Application No. 2016-129365, dated on Aug. 14, 2018.

*Primary Examiner* — Selim U Ahmed
*Assistant Examiner* — Andre Stevenson
(74) *Attorney, Agent, or Firm* — Keating & Bennett, LLP

(57) ABSTRACT

An electronic component device includes a mount substrate including an outer electrode on one principal surface and a mount electrode on another principal surface, at least one substrate component including a terminal electrode on one principal surface, and that is mounted on the mount substrate by joining the terminal electrode to the mount electrode, and a sealing resin layer that is provided on the mount substrate on which the at least one substrate component is mounted. The sealing resin layer includes a region with a large thickness, and a top surface including an inclination.

20 Claims, 12 Drawing Sheets

(51) Int. Cl.
*H01L 23/31* (2006.01)
*H01L 23/525* (2006.01)
*H05K 1/18* (2006.01)
*H05K 3/30* (2006.01)
*H05K 3/34* (2006.01)
*H05K 7/10* (2006.01)
*H05K 1/14* (2006.01)
*H03H 9/05* (2006.01)
*H03H 9/10* (2006.01)

(52) U.S. Cl.
CPC ............... *H01L 2224/16225* (2013.01); *H01L 2224/32225* (2013.01); *H01L 2224/73204* (2013.01); *H01L 2924/181* (2013.01); *H01L 2924/1815* (2013.01); *H03H 9/059* (2013.01); *H03H 9/1085* (2013.01); *H05K 1/141* (2013.01); *H05K 2201/09827* (2013.01); *H05K 2201/10378* (2013.01); *H05K 2201/10734* (2013.01); *Y02P 70/613* (2015.11)

(56) References Cited

U.S. PATENT DOCUMENTS

| | | | |
|---|---|---|---|
| 2013/0098670 A1* | 4/2013 | Inoue | H05K 3/4007 174/264 |
| 2014/0151874 A1 | 6/2014 | Obu et al. | |
| 2014/0361318 A1* | 12/2014 | Miki | H01L 33/505 257/88 |
| 2016/0093780 A1* | 3/2016 | Beppu | H01L 33/60 257/98 |

FOREIGN PATENT DOCUMENTS

| | | |
|---|---|---|
| JP | 2007-235303 A | 9/2007 |
| JP | 2008-263407 A | 10/2008 |
| JP | 2013-207172 A | 10/2013 |
| JP | 2013-214765 A | 10/2013 |
| JP | 2014-132635 A | 7/2014 |
| KR | 10-1999-0028493 A | 4/1999 |

* cited by examiner

ELECTRONIC COMPONENT DEVICE, METHOD OF MOUNTING ELECTRONIC COMPONENT DEVICE ON CIRCUIT BOARD, AND MOUNTING STRUCTURE OF ELECTRONIC COMPONENT DEVICE ON CIRCUIT BOARD

CROSS REFERENCE TO RELATED APPLICATIONS

This application claims the benefit of priority to Japanese Patent Application No. 2016-129365 filed on Jun. 29, 2016. The entire contents of this application are hereby incorporated herein by reference.

BACKGROUND OF THE INVENTION

1. Field of the Invention

The present invention relates to an electronic component device, and, more particularly, to an electronic component device that is capable of being reliably mounted on, for example, a circuit board without connection failure.

In addition, the present invention relates to a method of mounting an electronic component device on a circuit board, and, more particularly, to a method of mounting an electronic component device on a circuit board, which makes it possible to reliably mount the electronic component device on the circuit board without connection failure.

Further, the present invention relates to a mounting structure of an electronic component device on a circuit board, and, more particularly, to a mounting structure of an electronic component device on a circuit board, which makes it possible to reliably mount the electronic component device on the circuit board without connection failure.

2. Description of the Related Art

An electronic component device including a substrate component that is mounted on a mount substrate and a sealing resin layer that is formed thereon is widely used.

Such an electronic component device is disclosed in Japanese Unexamined Patent Application Publication No. 2007-235303. FIG. 9 illustrates an electronic component device (electronic component) 1000 disclosed in Japanese Unexamined Patent Application Publication No. 2007-235303. The electronic component device 1000 is a surface acoustic wave device.

The electronic component device 1000 includes a mount substrate (wiring substrate) 101. The mount substrate 101 is made of, for example, alumina. Outer electrodes (terminal electrodes) 102 are formed on a lower principal surface of the mount substrate 101. Conductive vias (via holes) 103 are formed in the mount substrate 101 so as to extend through both principal surfaces of the mount substrate 101. Further, mount electrodes (pattern electrodes) 104 are formed on an upper principal surface of the mount substrate 1. The outer electrodes 102 and the mount electrodes 104 are connected to each other by the conductive vias 103.

The electronic component device 1000 includes a substrate component (functional element) 105. The substrate component 105 is formed with a piezoelectric substrate made of, for example, lithium tantalate defining and functioning as a base. A functional portion 106, which is formed from a comb-type electrode, is formed on a lower principal surface of the piezoelectric substrate. Terminal electrodes (not shown) are also formed on the lower principal surface of the piezoelectric substrate.

In the electronic component device 1000, the substrate component 105 is mounted on the mount substrate 101 by a face-down method as a result of joining the terminal electrode at the substrate component 105 and the mount electrodes 104 on the mount substrate 101 to each other with a joining material (conductive bumps) 107.

The electronic component device 1000 further includes a sealing resin layer 108 that is formed on the mount substrate 101 on which the substrate component 105 is mounted. The sealing resin layer 108 is not formed between the mount substrate 101 and the substrate component 105, as a result of which a space is formed therebetween. The functional portion 106 that is formed on the piezoelectric substrate is disposed in the space.

The electronic component device 1000 is used by being mounted on, for example, a circuit board by, for example, a method shown in FIGS. 10A to 10D. FIGS. 10A to 10D have been drawn by the applicant for this matter for description purposes, and are not figures illustrated in Japanese Unexamined Patent Application Publication No. 2007-235303.

First, as shown in FIG. 10A, a circuit board 501 is prepared. A plurality of mount electrodes 502 are formed on an upper principal surface of the circuit board 501.

Next, as shown in FIG. 10B, for example, a solder paste 503 is applied as a joining material to the mount electrodes 502.

Next, as shown in FIG. 10C, a mount nozzle MN is used to bring outer electrodes 102 into contact with the mount electrodes 502 to which the solder paste 503 has been applied and to dispose the electronic component device 1000 on the circuit board 501.

Lastly, the solder paste 503 is heated and melted, and is cooled and solidified to, as shown in FIG. 10D, join the mount electrodes 502 and the outer electrodes 102 to each other with the solder paste 503 and to complete the mounting of the electronic component device 1000 on the circuit board 501.

An electronic component device, like the electronic component device 1000, including a substrate component 105 that is mounted on a mount substrate 101 and a sealing resin layer 108 that is formed thereon allows a very complex and advanced electronic circuit to be formed as a whole by causing the electronic circuit that is formed on the substrate component 105 to be complex and advanced or by increasing the number of substrate components 105. As the electronic circuit that is formed becomes complex and advanced, the number of outer electrodes 102 that are formed on the lower principal surface of the electronic component device 1000 (mount substrate 101) tends to increase.

The outer electrodes 102 may, on the basis of their function, be classified into signal outer electrodes that are connected to a signal line and ground outer electrodes that are used for grounding.

In the electronic component device 1000, connection failure sometimes occurs due to the areas (formation densities) of the outer electrodes 102 that are formed on the lower principal surface of the electronic component device 1000 not being equal to each other or the outer electrodes not being equally distributed in terms of types of outer electrodes.

The principles that cause, when the electronic component device is mounted on, for example, a circuit board, connection failure due to the areas (formation densities) of the outer electrodes 102 not being equal to each other or the outer electrodes not being equally distributed in terms of types of outer electrodes are described below with reference to figures. The figures that are used for describing the principles are FIGS. 11A, 11B, 12A, and 12B. These figures have been drawn by the applicant for this matter for description purposes, and are not figures illustrated in Japanese Unexamined Patent Application Publication No. 2007-235303. Here, for convenience of explanation, simplified electronic component devices 1100 and 1200 are shown instead of the electronic component device 1000.

FIG. 11A illustrates the electronic component device 1100. FIG. 11A is a plan view of the electronic component device 1100, and also shows in perspective outer electrodes 102 that are formed on a lower principle surface.

From convenience of explanation, as shown in FIG. 11A, the electronic component device 1100 viewed in a planar direction is divided into four regions, that is, an upper left region, a lower left region, an upper right region, and a lower right region in the figure. Each region is illustrated as being surrounded by a square frame. The upper left region and the lower left region together constitute a left region. Similarly, the upper right region and the lower right region together constitute a right region. The upper left region and the upper right region together constitute an upper region. The lower left region and the lower right region together constitute a lower region. In this application document, the same regions may be used below.

In the electronic component device 1100, three outer electrodes 102 are formed in the upper region, and a total of three outer electrodes 102 are formed in the lower region. The outer electrodes 102 in the upper region and the outer electrodes 102 in the lower region are equal in number.

In contrast, in the electronic component device 1100, four outer electrodes 102 are formed in the left region, and two outer electrodes 102 are formed in the right region. The outer electrodes 102 in the left region and the outer electrodes 102 in the right region are not equal in number.

When, with such an arrangement of the outer electrodes 102, the electronic component device 1100 is mounted on the circuit board 501, connection failure sometimes occurs as shown in FIG. 11B. That is, when a solder paste is heated and melted, the outer electrodes 102 in the left region with a larger number of outer electrodes 102 may be pulled towards mount electrodes 502 by the adhesiveness of the molten solder paste 503, as a result of which the right region is sometimes raised. And then, the outer electrodes 102 formed in the right region and the mount electrodes 502 may not be joined to each other with the solder paste 503, as a result of which joining failure sometimes occurs. That is, joining failure sometimes occurs due to the areas (formation densities) of the outer electrodes in the regions not being equal to each other.

Next, connection failure caused by the outer electrodes 102 not being equally distributed in terms of types of outer electrodes 102 is described.

FIG. 12A shows the electronic component device 1200. FIG. 12A is a plan view of the electronic component device 1200, and also shows in perspective outer electrodes 102 that are formed on a lower principle surface.

In the electronic component device 1200, eight outer electrodes are formed. The outer electrodes may, on the basis of their function, be classified into four signal outer electrodes 102S and four ground outer electrodes 102G. As described above, the signal outer electrodes 102S are outer electrodes that are connected to a signal line, and the ground outer electrodes 102G are outer electrodes that are used for grounding.

In the electronic component device 1200, as shown in FIG. 12A, the signal outer electrodes 102S and the ground outer electrodes 102G are not equally distributed. That is, two signal outer electrodes 102S are formed in each of the upper left region and the lower left region, and two ground outer electrodes 102G are formed in each of the upper right region and the lower right region.

In the electronic component device 1200, the areas (formation densities) of the outer electrodes are equal to each other. That is, two signal outer electrodes 102S or two ground outer electrodes 102G are formed in each of the upper right region, the lower right region, the upper left region, and the lower left region. The signal outer electrodes 102S and the ground outer electrodes 102G have the same area. Therefore, the area (formation density) of the outer electrodes in the upper region and the area (formation density) of the outer electrodes in the lower region are equal to each other, and the area (formation density) of the outer electrodes in the left region and the area (formation density) of the outer electrodes in the right region are equal to each other.

However, in the electronic component device 1200, from the viewpoint of the arrangement of the signal outer electrodes 102S and the ground outer electrodes 102G, they are not equally distributed in the left region and the right region. That is, four signal outer electrodes 102S are formed in the left region, whereas four ground outer electrodes 102G are formed in the right region.

The mount electrodes that are formed on the circuit board 501 on which the electronic component device 1200 is mounted may also be classified into signal mount electrodes 502S to which the signal outer electrodes 102S are connected and ground mount electrodes 502G to which the ground outer electrodes 102G are connected.

When the signal mount electrodes 502S and the ground mount electrodes 502G are compared, in general, heat dissipation of the signal mount electrodes 502S is low, and heat dissipation of the ground mount electrodes 502G is high. That is, in the circuit board 501, ordinarily, the signal mount electrodes 502S are only connected to one predetermined location. In contrast, in the circuit board 501, ordinarily, the ground mount electrodes 502G are connected to a plurality of locations, such as other multiple ground mount electrodes and ground electrodes. Ground electrodes with very large areas may be included among the ground electrodes. Due to the number of connection locations, in general, the heat dissipation of the signal mount electrodes 502S is low, and the heat dissipation of the ground mount electrodes 502G is high.

Due to this difference in heat dissipation, when the solder paste 503 is melted by so-called reflow heating, the solder paste 503 applied to the signal mount electrodes 502S melts quickly and becomes hot. In contrast, the solder paste 503 applied to the ground mount electrodes 502G takes time to melt, and does not easily become hot.

As a result, when the electronic component device 1200 is mounted on the circuit board 501, as shown in FIG. 12B, connection failure sometimes occurs. That is, the solder paste 503 formed on the signal mount electrodes 502S formed in the left region melts quickly and becomes hot. As a result, the solder paste 503 may pull the signal outer electrodes 102S formed in the left region, as a result of which the right region is sometimes raised. In addition, the ground outer electrodes 102G formed in the right region and the ground mount electrodes 502G formed at the right region may not be joined to each other with the solder paste 503, as a result of which joining failure sometimes occurs. That is, joining failure sometimes occurs due to an unequal distribution of the outer electrodes in terms of types of outer electrodes.

SUMMARY OF THE INVENTION

A preferred embodiment of the present invention provides an electronic component device including a mount substrate including an outer electrode on principal surface and a mount electrode on another principle surface; at least one substrate component on whose one principal surface a terminal electrode is provided, and that is mounted on the mount substrate by joining the terminal electrode to the mount electrode; and a sealing resin layer that is provided on the mount substrate on which the at least one substrate component is mounted. In the electronic component device, the sealing resin layer includes a region with a large thickness, and a top surface including an inclination.

The thickness of the sealing resin layer refers to the thickness including the substrate component built in the sealing resin layer. In addition, the inclination refers to a portion with a height that varies other than in a vertical form.

For example, when viewed in a planar direction, the mount substrate may include a region where a formation density of the outer electrode is low, and the region of the sealing resin layer with the large thickness and the region of the mount substrate where the formation density of the outer electrode is low may overlap each other. As mentioned above, the region where the formation density of the outer electrode is low tends to be raised after reflow. However, when the thickness of the sealing resin layer in this region is made large, in a temporal arrangement using a mount nozzle or the like before the reflow, the region that tends to be raised is able to be pushed deeply in a direction of, for example, the circuit board on which the region is mounted, and the raising of the region after the reflow can be suppressed. In addition, it is possible to prevent mounting failure caused by the raising of the region.

Alternatively, a plurality of the outer electrodes may be provided, the outer electrodes may be classified into a signal outer electrode and a ground outer electrode, and, when viewed in a planar direction, the mount substrate may include a region where a formation density of the ground outer electrode is high, and the region of the sealing resin layer with the large thickness and the region of the mount substrate where the formation density of the ground outer electrode is high may overlap each other. As described above, the region where the formation density of the ground outer electrode is high tends to be raised after the reflow. However, when the thickness of the sealing resin layer in this region is made large, in a temporal arrangement using a mount nozzle or the like before the reflow, the region that tends to be raised is able to be pushed deeply in a direction of, for example, the circuit board on which the region is mounted, and the raising of the region after the reflow can be suppressed. In addition, it is possible to prevent mounting failure caused by the raising of the region.

The region of the sealing resin layer with the large thickness may be provided by, for example, mounting the at least one substrate component in the region of the sealing resin layer with the large thickness.

Alternatively, the region of the sealing resin layer with the large thickness may be provided by mounting one of the at least one substrate component with a thickness that is greater than a thickness of another of the at least one substrate component in the region of the sealing resin layer with the large thickness.

Alternatively, when the sealing resin layer is provided by molding using dies, the region of the sealing resin layer with the large thickness may be provided by causing a gap between the dies to be large at the region of the sealing resin layer with the large thickness.

Alternatively, the inclination of the top surface of the sealing resin layer may be provided by cutting the top surface of the sealing resin layer.

According to a preferred embodiment of the present invention, there is provided a method of mounting an electronic component device on a circuit board. The method includes the steps of preparing a circuit board including a mount electrode on one principal surface; preparing the electronic component device including a mount substrate including an outer electrode on one principal surface, at least one substrate component that is mounted on the other principal surface of the mount substrate, and a sealing resin layer that is formed on the mount substrate on which the at least one substrate component is mounted, the sealing resin layer with a region with a large thickness; providing a soft joining material on the mount electrode that is formed on the circuit board; temporarily disposing the electronic component device on the circuit board such that a gap between the electronic component device and the circuit board becomes smallest at the region of the sealing resin layer with the large thickness by bringing the outer electrode into contact with the joining material and disposing the electronic component device on the circuit board and subsequently pushing the electronic component device in a direction of the circuit board and thus pushing the outer electrode into the joining material; and joining the mount electrode and the outer electrode to each other with the joining material by heating and melting the joining material and cooling and solidifying the joining material.

A preferred embodiment of the present invention provides a mounting structure of an electronic component device on a circuit board. In the mounting structure, the circuit board includes a mount electrode on one principal surface thereof, the electronic component device includes a mount substrate including an outer electrode on one principal surface thereof, at least one substrate component that is mounted on the other principal surface of the mount substrate, and a sealing resin layer that is provided on the mount substrate on which the at least one substrate component is mounted, the sealing resin layer including a region with a large thickness. In addition, in the mounting structure, the mount electrode and the outer electrode are joined to each other with a joining material, and the electronic component device after being mounted has a largest height at the region of the sealing resin layer with the large thickness.

An electronic component device according to a preferred embodiment of the present invention is capable of being reliably mounted on, for example, a circuit board without connection failure by previously making large the thickness of the sealing resin layer at a region that tends to be raised after mounting the electronic component device.

A method of mounting an electronic component device on a circuit board according to a preferred embodiment of the present invention also makes it possible to reliably mount the electronic component device on the circuit board without connection failure by previously making large the thickness of the sealing resin layer at a region that tends to be raised after mounting the electronic component device.

The mounting structure of an electronic component device on a circuit board according to preferred embodiments of the present invention also makes it possible to reliably mount the electronic component device on the circuit board without connection failure by previously increasing the thickness of the sealing resin layer at a region that tends to be raised after mounting the electronic component device.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention are described below with reference to the drawings.

Each of the preferred embodiments of the present invention is an illustrative exemplification of the present invention, and the present invention is not limited to the content of these preferred embodiments. Contents of different preferred embodiments of the present invention may be combined to carry out the present invention, and the contents regarding the carrying out of the present invention in this case are also included in the present invention. The drawings are provided as an aid for understanding the preferred embodiments, and may not necessarily be exact drawings. For example, the proportion between the dimensions of structural elements that are drawn may not correspond with the proportion between the dimensions thereof described in the specification. For example, structural elements described in the specification may be omitted in the figures, or a smaller number of structural elements may be drawn.

First Preferred Embodiment

Figure 1A:
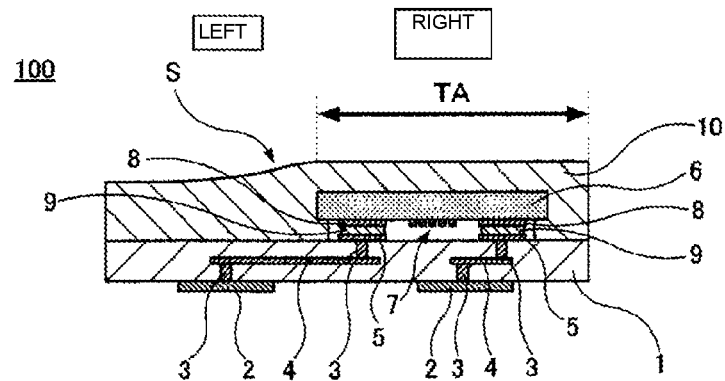
FIG. 1A is a sectional view of an electronic component device according to a first preferred embodiment of the present invention.
Figure 1B:
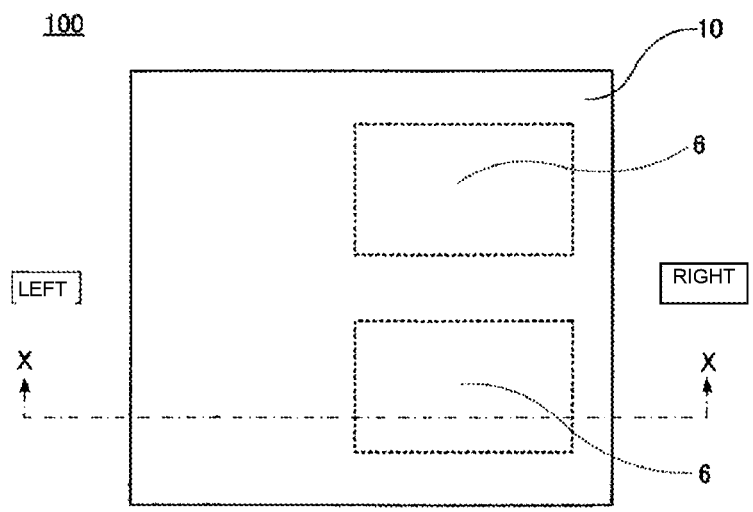
FIGS. 1B and 1C are each a plan view of the electronic component device according to the first preferred embodiment of the present invention.
Figure 1C:
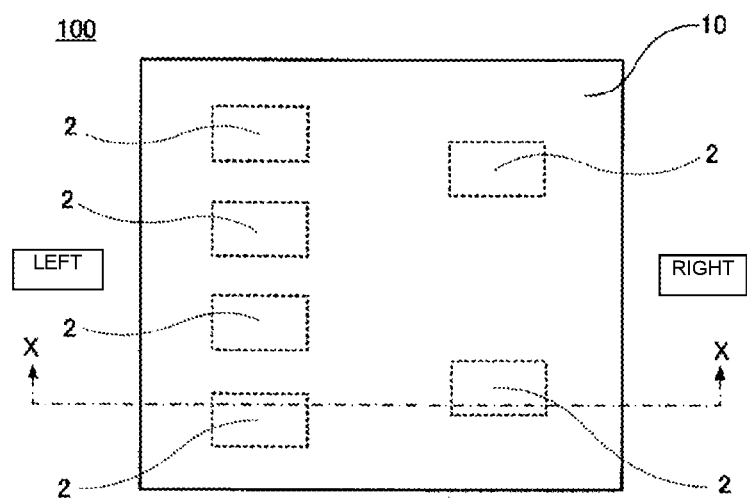

FIGS. 1A to 1C illustrate an electronic component device 100 according to a first preferred embodiment of the present invention. FIG. 1A is a sectional view of the electronic component device 100. FIG. 1B is a plan view of the electronic component device 100, and also shows in perspective built-in substrate components 6. FIG. 1C is also a plan view of the electronic component device 100, and also shows in perspective outer electrodes 2 that are on a lower principal surface. The sectional view of FIG. 1A shows a portion taken along a dash-dot line X-X in each of FIGS. 1B and 1C.

The electronic component device 100 is preferably a surface acoustic wave device, for example.

The electronic component device 100 includes a mount substrate 1. The mount substrate 1 is preferably made of ceramic, such as alumina. However, the mount substrate 1 may be made of any material, such as glass ceramic or resin, instead of ceramic.

The outer electrodes 2 are provided on the lower principal surface of the mount substrate 1. Via conductors 3 and interlayer conductors 4 are formed in the mount substrate 1. Mount electrodes 5 are provided on an upper principal surface of the mount substrate 1. The outer electrodes 2 and the mount electrodes 5 are connected to each other via the via conductors 3 and the interlayer conductors 4.

In the present preferred embodiment as shown in FIG. 1C, the number of outer electrodes 2 in the left region and the number of outer electrodes 2 in the right region preferably differ from each other. That is, four outer electrodes 2 are provided in the left region, and two outer electrodes 2 are provided in the right region. The formation densities of the outer electrodes in these two regions are not equal to each other. Three outer electrodes 2 are provided in the upper region, and three outer electrodes 2 are also provided in the lower region, as a result of which the formation densities of the outer electrodes in these two regions are equal or substantially equal to each other.

The electronic component device 100 preferably includes two substrate components 6. In the present preferred embodiment, each substrate component 6 is provided with a piezoelectric substrate, such as an $LiNbO_3$ substrate, an $LiTaO_3$ substrate, or a quartz substrate, being a base.

A functional portion 7, which is preferably defined by, for example, a comb electrode, is provided on a lower principal surface of each substrate component 6. Terminal electrodes 8 are provided on the lower principal surface of each substrate component 6.

By joining the terminal electrodes 8 on the mount electrodes 5 through a joining material 9 (such as conductive bumps made of, for example, Au), each substrate component 6 is mounted on the mount substrate 1 by flip-chip mounting.

In the present preferred embodiment, the two substrate components 6 are mounted so as to be localized in the right region. That is, the two substrate components 6 are mounted so as to be localized in the region where the formation density of the outer electrodes 2 is low.

A sealing resin layer 10 is provided on the mount substrate 1 on which each substrate component 6 is mounted. Although the sealing resin layer 10 may be made of any desirable material, for example, epoxy resin may preferably be used.

As shown in FIG. 1A, the sealing resin layer 10 is preferably thicker at a right region thereof where the substrate components 6 are mounted so as to be localized therein than at a left region thereof where the substrate components 6 are not mounted. This thicker region is a region TA. By providing the region TA of the sealing resin layer 10 with the large thickness, a top surface of the sealing resin layer 10 has an inclination S.

The sealing resin layer 10 is not provided in a gap between the mount substrate 1 and each substrate component 6. That is, since the gap between the mount substrate 1 and each substrate component 6 is small, a space is provided here without being filled by the sealing resin layer 10. The functional portion 7 on each substrate component 6 is disposed in this space. In order to reliably define a space in this portion, the mount substrate 1 and/or the substrate components 6 may be provided with a ring-shaped protrusion (dam) that prevents the resin from flowing in.

In the electronic component device 100 according to the first preferred embodiment with the above-described structure, since the substrate components 6 are mounted so as to be localized in the right region where the formation density of the outer electrodes 2 is low, the region TA of the sealing resin layer 10 with the large thickness is provided at the right region.

The electronic component device 100 according to the first preferred embodiment can preferably be manufactured by, for example, the following method. A plurality of electronic component devices 100 are usually manufactured all at once by using a mother board. Here, as a matter of convenience, the case in which one electronic component device 100 is manufactured is described.

First, substrate components 6 on which a functional portion 7 (which is preferably formed of, for example, a comb electrode) and terminal electrodes 8 are formed are prepared. In conjunction with this, a mount substrate 1 where outer electrodes 2, via conductors 3, interlayer conductors 4, and mount electrodes 5 are formed is prepared. For the substrate components 6 and the mount substrate 1, those which are widely used can be used.

Next, conductive bumps defining and functioning as a joining material 9 are formed on the terminal electrodes 8 existing at the substrate components 6 by, for example, a stud bump method.

Next, by using the joining material 9, the terminal electrodes 8 and the mount electrodes 5 are joined to each other to mount the substrate components 6 on the mount substrate 1 by flip-chip mounting for example. More specifically, with the substrate components 6 being mounted on the mount substrate 1, heating is performed, the substrate components 6 are pushed in the direction of the mount substrate 1, and ultrasonic waves are applied, so that the terminal electrodes 8 and the mount electrodes 5 are joined to each other with the joining material 9.

Next, a semi-molten resin sheet is made to cover the mount substrate 1 on which the substrate components 6 have been mounted. Then, evacuation is performed to cause the surrounding environment to be in a vacuous state. Further, the resin sheet that has been heated and brought into a semi-molten state is solidified to form the sealing resin layer 10 on the mount substrate 1 on which the substrate components 6 have been mounted.

By performing the above process, the electronic component device 100 is completed.

The electronic component device 100 according to the first preferred embodiment is mounted on, for example, a circuit board 501 by, for example, the method shown in FIGS. 2A to 2D.

Figure 2A:
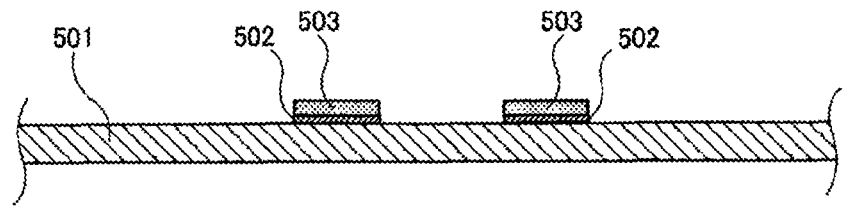
FIGS. 2A to 2D are sectional views illustrating steps that are performed in an exemplary method of mounting the electronic component device according to the first preferred embodiment of the present invention.

First, as shown in FIG. 2A, the circuit board 501 on which mount electrodes 502 are provided is prepared and, for example, a solder paste 503, defining and functioning as a joining material, is applied to the mount electrodes 502.

Figure 2B:
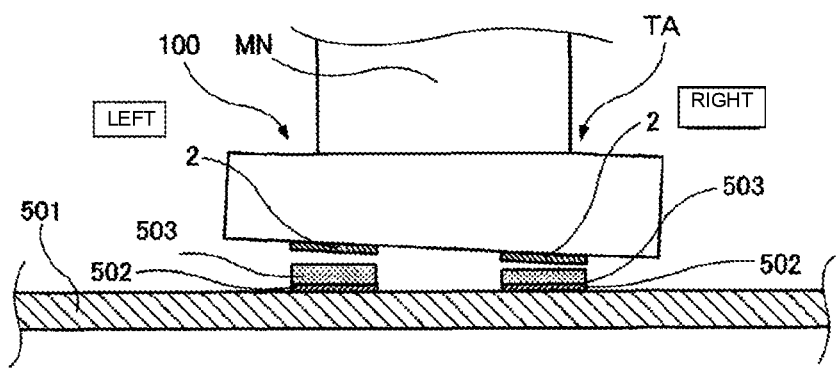

Next, as shown in FIG. 2B, a mount nozzle MN is used to suck the electronic component device 100 and move the electronic component device 100 towards a predetermined mount position on the circuit board 501. At this time, the electronic component device 100 includes a region TA, where the thickness of the sealing resin layer 10 is large, in the right region, so that the electronic component device 100 is sucked by the mount nozzle MN so as to be in a state in which the right region is inclined downward.

Figure 2C:
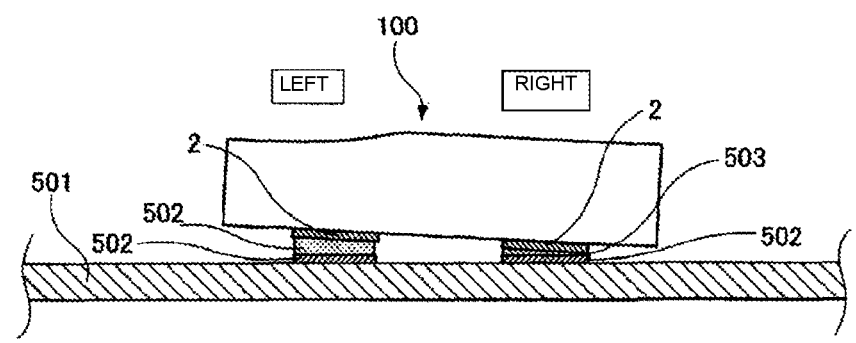

Next, when the electronic component device 100 is pushed in the direction of the circuit board 501 by using the mount nozzle MN, as shown in FIG. 2C, the electronic component device 100 is temporarily disposed on the mount position on the circuit board 501 with the right region being inclined downward. That is, with the outer electrodes 2 located in the right region of the electronic device 100 deeply pushed into the solder paste (joining material) 503 applied to the mount electrodes 502 on the circuit board 501, the electronic component device 100 is temporarily disposed. In other words, the electronic component device 100 is temporarily disposed such that, in the region TA of the sealing resin layer 10 with the large thickness, the distance between the electronic component device 100 and the circuit board 501 is smallest.

Figure 2D:
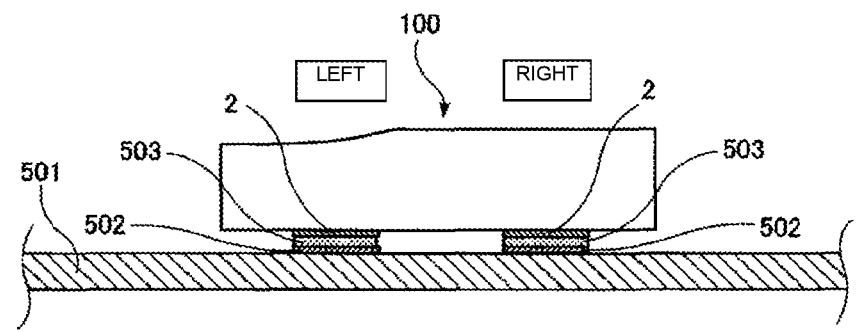

Next, the solder paste 503 is heated and melted, and is then cooled and solidified. When the solder paste 503 has been melted, a left region thereof where the formation density of the outer electrodes 2 is high is pulled more in the direction of the circuit board 501 than is a right region thereof where the formation density of the outer electrodes 2 is low. However, the electronic component device 100 is temporarily disposed with the right region being previously pushed in the direction of the circuit board 501. Therefore, when the solder paste 503 is solidified, as shown in FIG. 2D, the electronic component device 100 is mounted on the circuit board 501 with the lower principal surface of the electronic component device 100 being parallel or substantially parallel to the circuit board 501. As a result, the height of the region TA of the sealing resin layer 10 with the large thickness becomes the largest.

Since the electronic component device 100 is mounted on the circuit board 501 with the lower principal surface of the electronic component device 100 being parallel or substantially parallel to the circuit board 501, the outer electrodes 2 that have been provided in the left region and the outer electrodes 2 that have been provided in the right region are properly joined to the mount electrodes 502.

As described above, since the region TA of the sealing resin layer 10 with the large thickness is provided in the region where the formation density of the outer electrodes 2 is low and that tends to be raised during mounting, the electronic component device 100 according to the first preferred embodiment is able to be reliably mounted on, for example, the circuit board without connection failure.

Second Preferred Embodiment

Figure 3A:
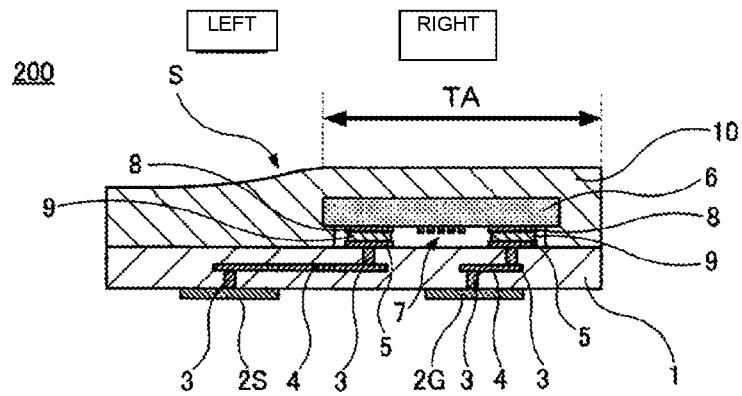
FIG. 3A is a sectional view of an electronic component device according to a second preferred embodiment of the present invention.
Figure 3B:
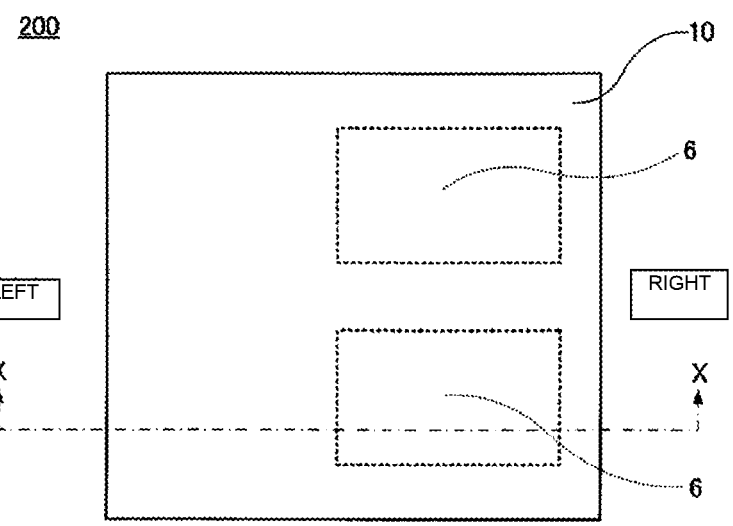
FIGS. 3B and 3C are plan views of the electronic component device according to the second preferred embodiment of the present invention.
Figure 3C:
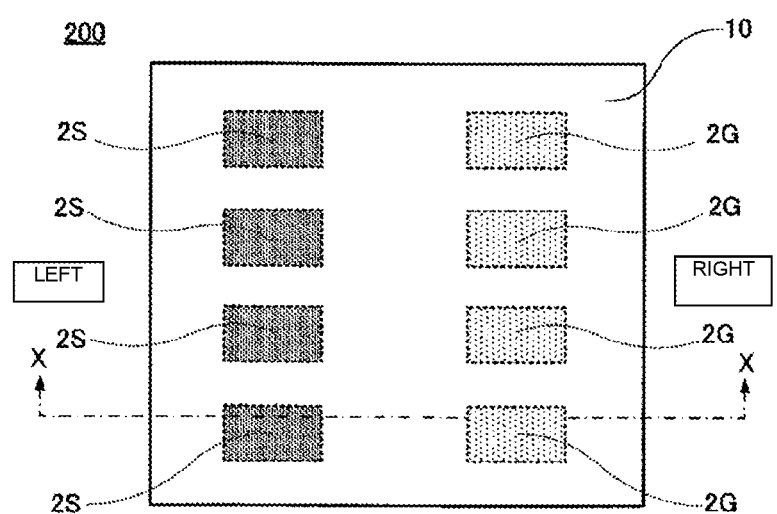

FIGS. 3A to 3C illustrate an electronic component device 200 according to a second preferred embodiment of the present invention. FIG. 3A is a sectional view of the electronic component device 200. FIG. 3B is a plan view of the electronic component device 200, and also shows in perspective built-in substrate components 6. FIG. 3C is also a plan view of the electronic component device 100, and also shows in perspective signal outer electrodes 2S and ground outer electrodes 2G that are provided on a lower principal surface. The sectional view of FIG. 3A shows a portion taken along a dash-dot line X-X in each of FIGS. 3B and 3C.

The electronic component device 200 is preferably a surface acoustic wave device, for example.

The electronic component device 200 includes a mount substrate 1.

The signal outer electrodes 2S and the ground outer electrodes 2G are provided on the lower principal surface of the mount substrate 1. Via conductors 3 and interlayer conductors 4 are provided in the mount substrate 1. Mount electrodes 5 are provided on an upper principal surface of the mount substrate 1.

In the present preferred embodiment, as shown in FIG. 3C, four signal outer electrodes 2S are provided in the left region, and four ground outer electrodes 2G are provided in the right region. That is, in the electronic component device 200, the formation densities of the outer electrodes in terms of types of outer electrodes are such that they are not equal to each other in the left region and in the right region.

In contrast, when the types of outer electrodes of the electronic component device 200 are not considered, the formation densities of the outer electrodes are equal to each other. That is, in each of the upper right region, the lower right region, the upper left region, and the lower left region, two signal outer electrodes 102S or two ground outer electrodes 102G are provided so that the formation density of the outer electrodes in the upper region and the formation density of the outer electrodes in the lower region are equal to each other, and the formation density of the outer electrodes in the left region and the formation density of the outer electrodes in the right region are equal to each other.

The electronic component device 200 includes two substrate components 6. In the present preferred embodiment, each substrate component 6 is preferably provided with a piezoelectric substrate, such as an LiNbO$_3$ substrate, an LiTaO$_3$ substrate, or a quartz substrate, being a base.

A functional portion 7, which is provided by, for example, a comb electrode, is provided on a lower principal surface of each substrate component 6. Terminal electrodes 8 are provided on the lower principal surface of each substrate component 6.

By joining the terminal electrodes 8 on the mount electrodes 5 with a joining material 9 (such as conductive bumps made of, for example, Au), each substrate component 6 is mounted on the mount substrate 1 by flip-chip mounting.

In the present preferred embodiment, the two substrate components 6 are preferably mounted so as to be localized in the right region. That is, the two substrate components 6 are mounted so as to be localized in the region where the formation density of the ground outer electrodes 2G is high.

A sealing resin layer 10 is provided on the mount substrate 1 on which each substrate component 6 is mounted. Although the sealing resin layer 10 may be made of any desirable material, for example, epoxy resin may be used.

As shown in FIG. 3A, the sealing resin layer 10 is thicker at a right region thereof where the substrate components 6 are mounted so as to be localized therein than at a left region thereof where the substrate components 6 are not mounted. This thicker region is a region TA. By providing the region TA of the sealing resin layer 10 with the large thickness, a top surface of the sealing resin layer 10 has an inclination S.

The sealing resin layer 10 is preferably not provided in a gap between the mount substrate 1 and each substrate component 6. That is, since the gap between the mount substrate 1 and each substrate component 6 is small, a space is provided here without being filled by the sealing resin layer 10. The functional portion 7 provided on each substrate component 6 is disposed in this space. In order to reliably form a space in this portion, the mount substrate 1 and/or the substrate components 6 may be provided with a ring-shaped protrusion (dam) for preventing the resin from flowing in.

Since the region TA of the sealing resin layer 10 with the large thickness is provided in the region where the formation density of the ground outer electrodes 2G is high and that tends to be raised during mounting, the electronic component device 200 according to the second preferred embodiment with the above-described structure is able to be reliably mounted on, for example, a circuit board without connection failure.

Third Preferred Embodiment

Figure 4:
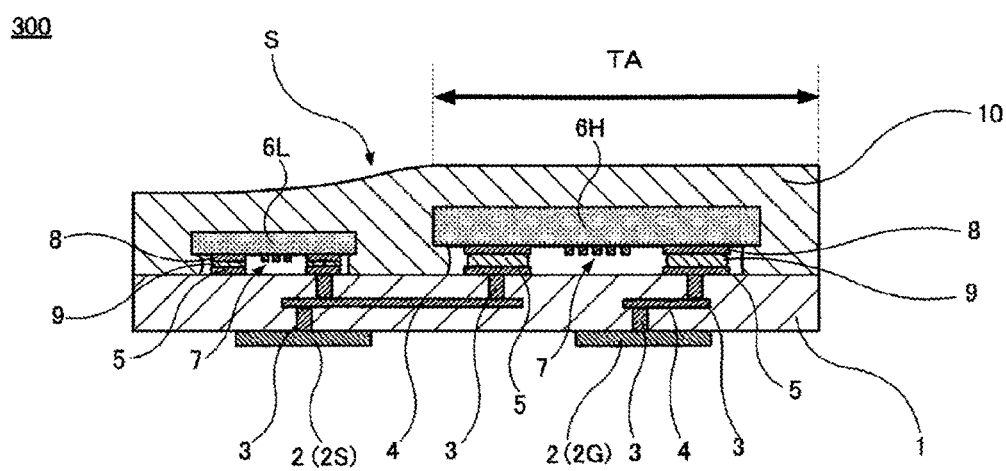
FIG. 4 is a sectional view of an electronic component device according to a third preferred embodiment of the present invention.

FIG. 4 illustrates an electronic component device 300 according to a third preferred embodiment of the present invention. FIG. 4 is a sectional view of the electronic component device 300.

The electronic component device 300 is an electronic component device in which changes have been made in the electronic component device 100 according to the first preferred embodiment or in the electronic component device 200 according to the second preferred embodiment.

That is, in the electronic component devices 100 or 200, two substrate components 6 with the same height or substantially the same height are built in the sealing resin layer 10. In the electronic component device 300, in place of two such substrate components 6, two substrate components 6H with a large height and two substrate components 6L with a small height are built in the sealing resin layer 10. FIG. 4 is a sectional view of one substrate component 6H with a large height and one substrate component 6L with a small height. The other structural features of the electronic component device 300 are the same as those of the electronic component device 100 or 200.

In the electronic component device 300, a region where the substrate components 6H with the large height are mounted is a region TA of the sealing resin layer 10 with a large thickness. Since the region TA of the sealing resin layer 10 with the large thickness is provided in the region that tends to be raised during mounting, the electronic component device 300 is also able to be reliably mounted on, for example, a circuit board without connection failure.

Fourth Preferred Embodiment

Figure 5A:
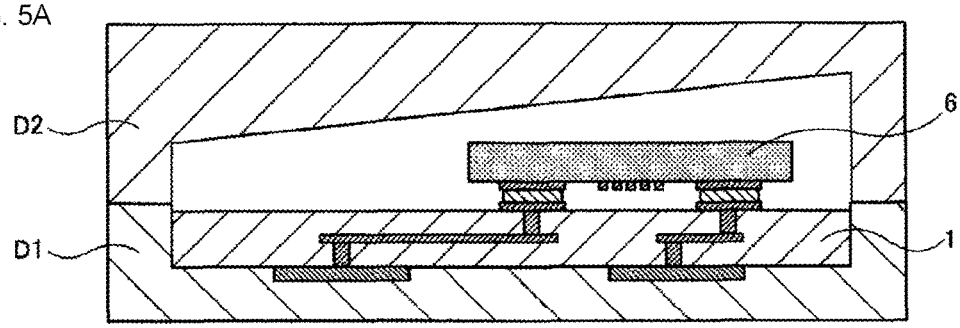
FIGS. 5A to 5C are sectional views illustrating steps that are performed in an exemplary method of manufacturing an electronic component device according to a fourth preferred embodiment of the present invention, with FIG. 5C being a sectional view of the electronic component device that is completed.
Figure 5B:
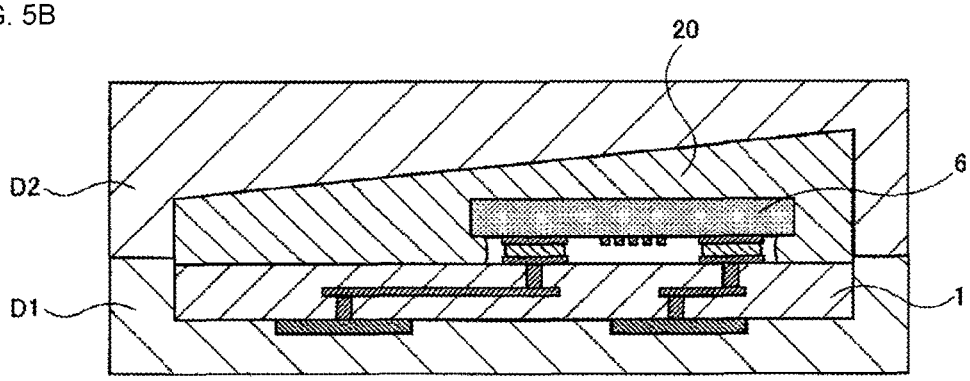
Figure 5C:
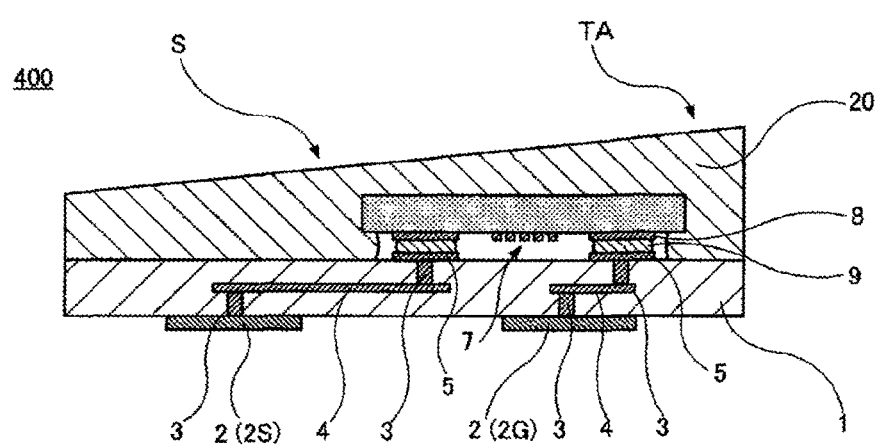

FIG. 5C illustrates an electronic component device 400 according to a fourth preferred embodiment of the present invention. FIG. 5C is a sectional view of the electronic component device 400.

The electronic component device 400 is an electronic component device in which changes have been made in the electronic component device 100 according to the first preferred embodiment or in the electronic component device 200 according to the second preferred embodiment.

As shown in FIG. 5C, in the electronic component device 400, a top surface of a sealing resin layer 20 has a planar inclination S. A region where the inclination S is large on the right in FIG. 5C is a region TA of the sealing resin layer 20 with a large thickness. The other structural features of the electronic component device 400 are the same as those of the electronic component device 100 or 200.

In the electronic component device 400, the inclination S of the top surface of the sealing resin layer 20 and the region TA of the sealing resin layer 20 with the large thickness are preferably formed by the following method.

First, substrate components 6 are mounted on a mount substrate 1.

Next, as shown in FIG. 5A, the mount substrate 1 on which the substrate components 6 have been mounted is placed in a space between a lower die D1 and an upper die D2. The lower die D1 and the upper die D2 are such that a gap that is situated at a portion where the region TA of the sealing resin layer 20 with the large thickness exists is formed so as to be large. An inner top surface of the upper die D2 has a planar inclination.

Next, as shown in FIG. 5B, the sealing resin layer 20 is formed by insert molding using resin between the lower die D1 and the upper die D2.

By taking out the molded product from the gap between the lower die D1 and the upper die D2, it is possible to obtain the completed electronic component device 400 shown in FIG. 5C.

Since the region TA of the sealing resin layer 20 with the large thickness is formed in the region that tends to be raised during mounting, the electronic component device 400 according to the fourth preferred embodiment is also able to be reliably mounted on, for example, a circuit board without connection failure.

Fifth Preferred Embodiment

Figure 6A:
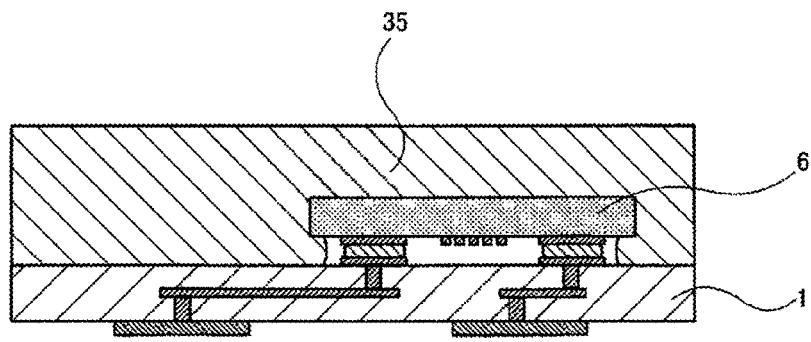
FIGS. 6A to 6C are each a sectional view illustrating a step that is performed in an exemplary method of manufacturing an electronic component device according to a fifth preferred embodiment of the present invention, with FIG. 6C being a sectional view of the electronic component device that is completed.
Figure 6B:
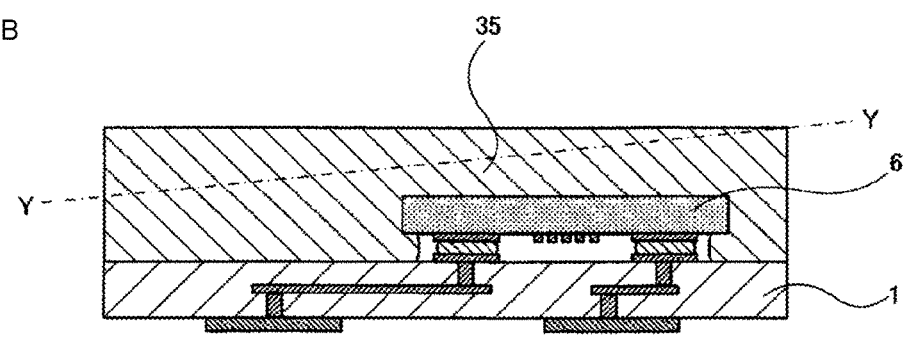
Figure 6C:
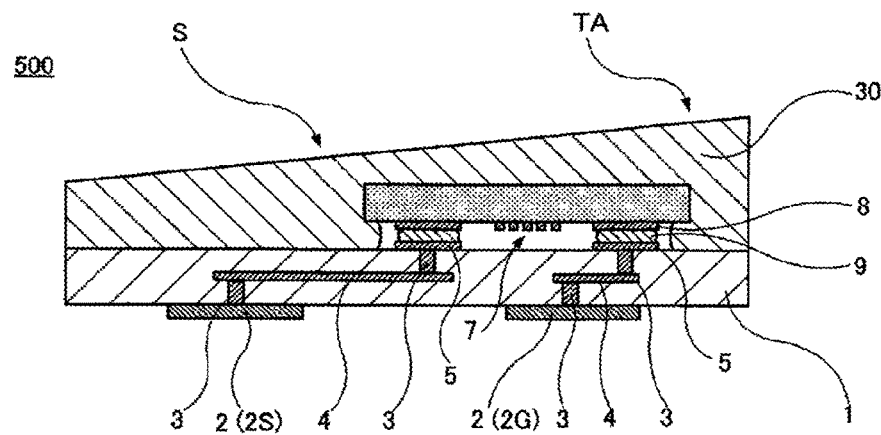

FIG. 6C illustrates an electronic component device 500 according to a fifth preferred embodiment of the present invention. FIG. 6C is a sectional view of the electronic component device 500.

The electronic component device 500 is an electronic component device in which changes have been made in the electronic component device 100 according to the first preferred embodiment or in the electronic component device 200 according to the second preferred embodiment.

As shown in FIG. 6C, in the electronic component device 500, a top surface of a sealing resin layer 30 has a planar inclination S. A region where the inclination S is large on the right in FIG. 6C is a region TA of the sealing resin layer 30 with a large thickness. The other structural features of the electronic component device 500 are the same as those of the electronic component device 100 or 200.

In the electronic component device 500, the inclination S of the top surface of the sealing resin layer 30 and the region TA of the sealing resin layer 30 with the large thickness are formed by the following method.

First, substrate components 6 are mounted on a mount substrate 1.

Next, as shown in FIG. 6A, a sealing resin layer 35 with a uniform thickness is provided on the mount substrate 1 on which the substrate components 6 have been mounted. The sealing resin layer 35 with the uniform thickness can preferably be formed by, for example, the following method. First, a semi-molten resin sheet is made to cover the mount substrate 1 on which the substrate components 6 have been mounted. Next, the resulting product is sandwiched from the top and the bottom by a pair of plate members to apply pressure thereto. Further, evacuation is performed to cause the surrounding environment to be in a vacuous state. Then, the resin sheet that has been heated and brought into a semi-molten state is solidified to form the sealing resin layer 35 with the uniform thickness.

Next, as shown in FIG. 6B, the sealing resin layer 35 with the uniform thickness is cut to a portion indicated by a dash-dot line Y-Y to form the sealing resin layer 30, as shown in FIG. 6C, with the inclination S at its top surface and with the region TA with the large thickness.

Since the region TA of the sealing resin layer 30 with the large thickness is provided in the region that tends to be raised during mounting, the electronic component device 500 according to the fifth preferred embodiment is also able to be reliably mounted on, for example, a circuit board without connection failure.

Sixth Preferred Embodiment

Figure 7A:
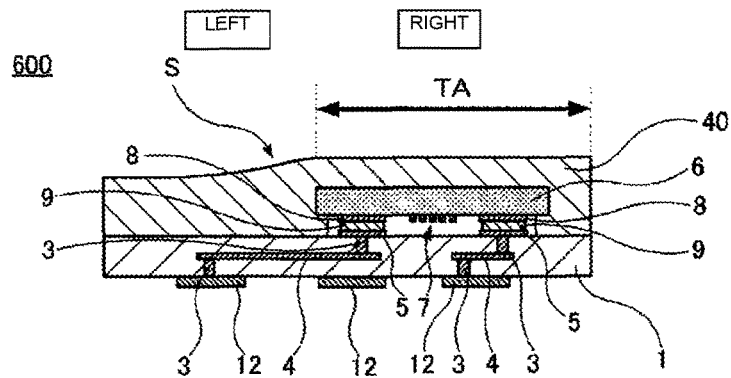
FIG. 7A is a sectional view of an electronic component device according to a sixth preferred embodiment of the present invention.
Figure 7B:
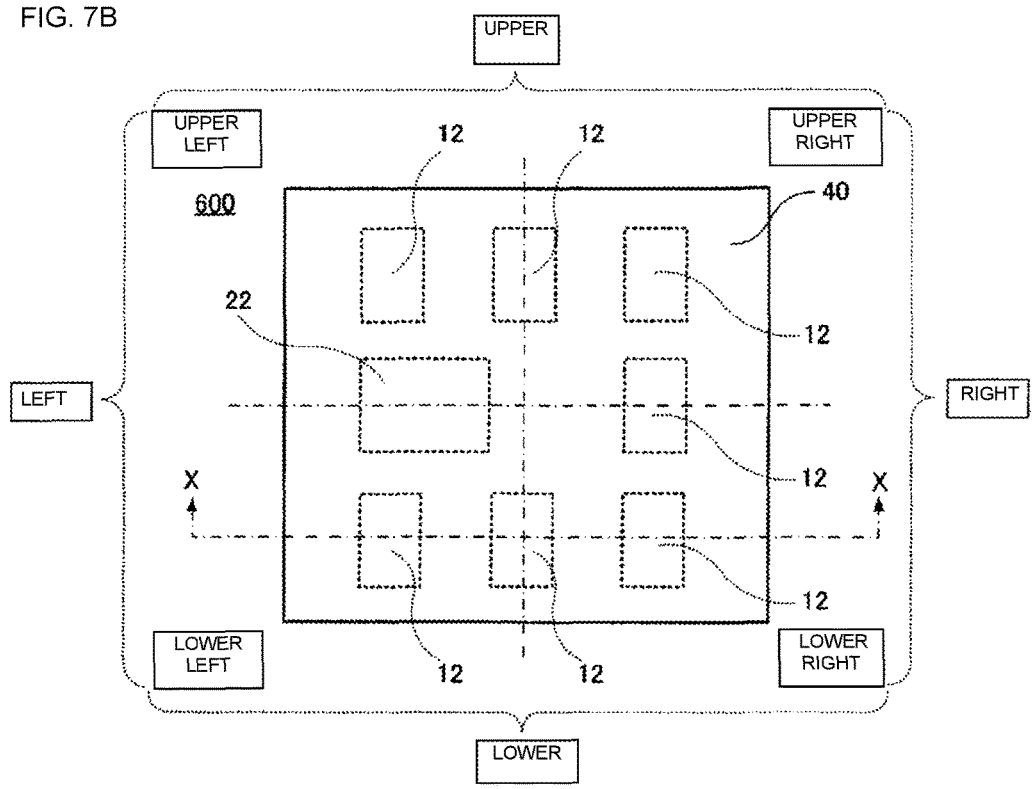
FIG. 7B is a plan view of the electronic component device according to the sixth preferred embodiment of the present invention.

FIGS. 7A and 7B illustrate an electronic component device 600 according to a sixth preferred embodiment of the present invention. FIG. 7A is a sectional view of the electronic component device 600. FIG. 7B is a plan view of the electronic component device 600, and also shows in perspective outer electrodes 12 and 22 that are provided on a lower principal surface. The sectional view of FIG. 7A shows a portion taken along a dash-dot line X-X in FIG. 7B.

The electronic component device 600 is an electronic component device in which changes have been made in the electronic component device 100 according to the first preferred embodiment.

That is, in the electronic component device 100, six outer electrodes 2 with the same area or substantially the same area are formed on the lower principal surface of the mount substrate 1, whereas, in the electronic component device 600, as shown in FIG. 7B, seven outer electrodes 12 with a small area and one outer electrode 22 with a large area are formed on the lower principal surface of the mount substrate 1. The area of the outer electrode 22 preferably is about twice the area of each outer electrode 12, for example. The other structural features of the electronic component device 600 are the same as those of the electronic component device 100.

A specific arrangement of the outer electrodes 12 and the outer electrode 22 is as shown in FIG. 7B.

That is, in the electronic component device 600, the outer electrodes 12 are provided in the upper left region so as to occupy an area corresponding to the area of about 2.5 outer electrodes, for example. In addition, the outer electrodes 12 are also provided in the lower left region so as to occupy an area corresponding to the area of about 2.5 outer electrodes, for example. In contrast, the outer electrodes 12 are provided in the upper right region so as to occupy an area corresponding to the area of about 2.0 outer electrodes, for example. In addition, the outer electrodes 12 are also provided in the lower right region so as to occupy an area corresponding to the area of about 2.0 outer electrodes, for example.

The outer electrodes 12 are provided in the upper region so as to occupy an area corresponding to the area of about 4.5 outer electrodes, and the outer electrodes 12 are provided in the lower region so as to occupy an area corresponding to the area of about 4.5 outer electrodes, for example. Therefore, the area of the outer electrodes 12 in the upper region and the area of the outer electrodes 12 in the lower region are equal to each other.

In contrast, the outer electrodes 12 are provided in the left region so as to occupy an area corresponding to the area of about 5.0 outer electrodes, and the outer electrodes 12 are provided in the right region so as to occupy an area corresponding to the area of about 4.0 outer electrodes, for example. Therefore, the area of the outer electrodes 12 in the left region and the area of the outer electrodes 12 in the right region are not equal to each other. Accordingly, even in the electronic component device 600, as shown in FIG. 7A, a region TA of the sealing resin layer 40 with a large thickness is provided in the right region where the formation density of the outer electrodes is low.

Since the region TA of the sealing resin layer 40 with the large thickness is provided in the region that tends to be raised during mounting, the electronic component device 600 according to the sixth preferred embodiment is also able to be reliably mounted on, for example, a circuit board without connection failure.

Seventh Preferred Embodiment

Figure 8A:
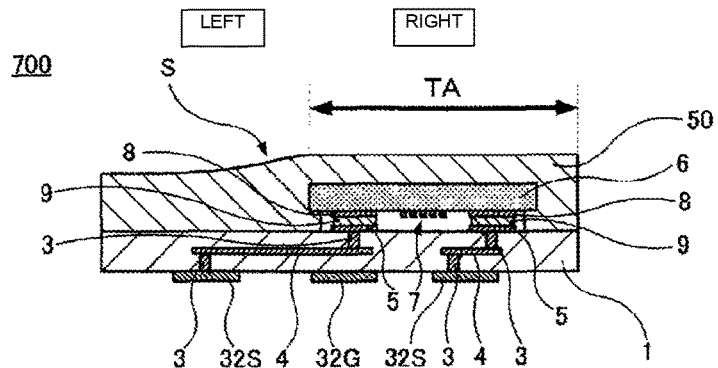
FIG. 8A is a sectional view of an electronic component device according to a seventh preferred embodiment of the present invention.
Figure 8B:
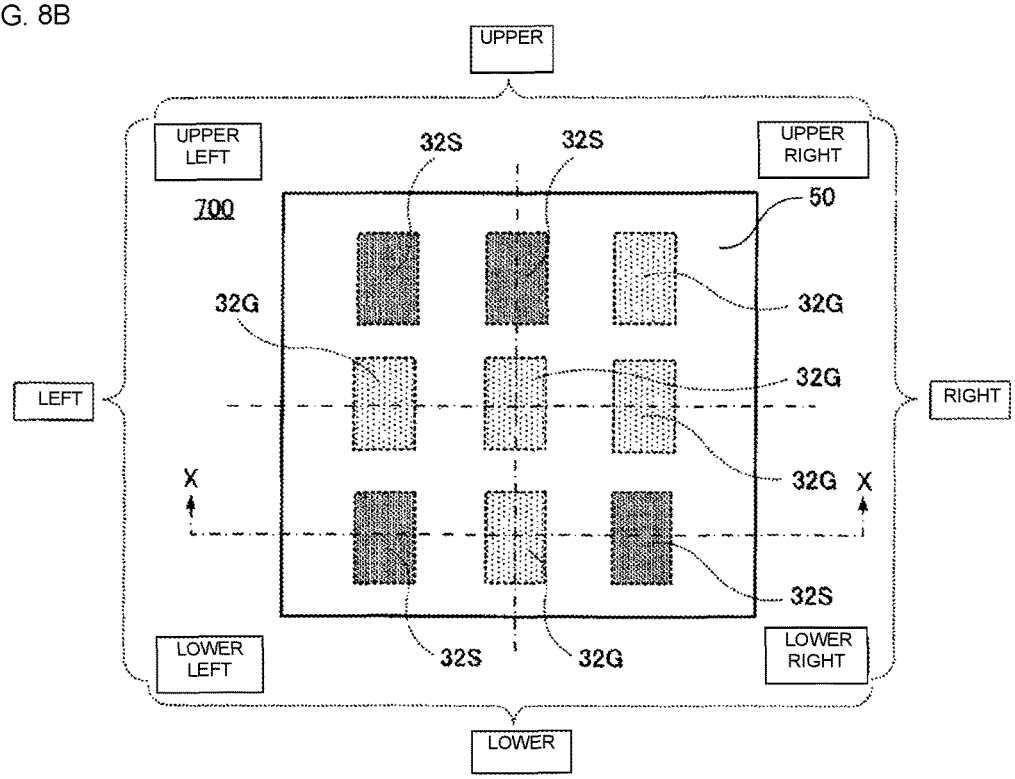
FIG. 8B is a plan view of the electronic component device according to the seventh preferred embodiment of the present invention.
Figure 9:
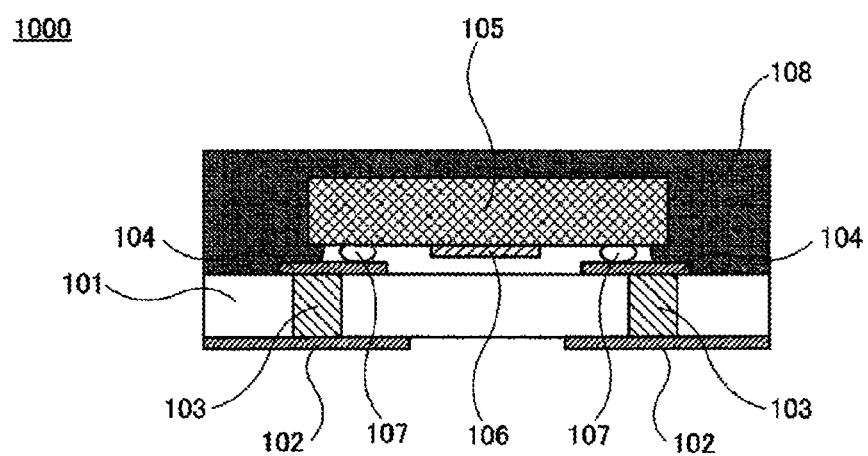
FIG. 9 is a sectional view of a conventional electronic component device disclosed in Japanese Unexamined Patent Application Publication No. 2007-235303.
Figure 10A:
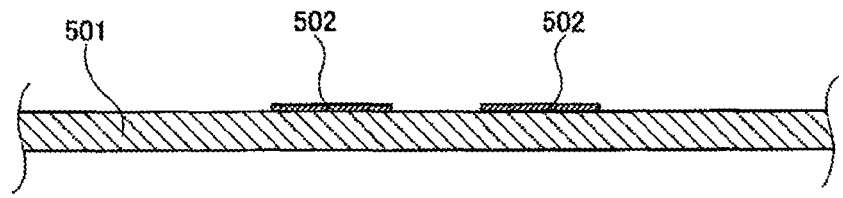
FIGS. 10A to 10D are each a sectional views illustrating steps that are performed in mounting the conventional electronic component device disclosed in Japanese Unexamined Patent Application Publication No. 2007-235303.
Figure 10B:
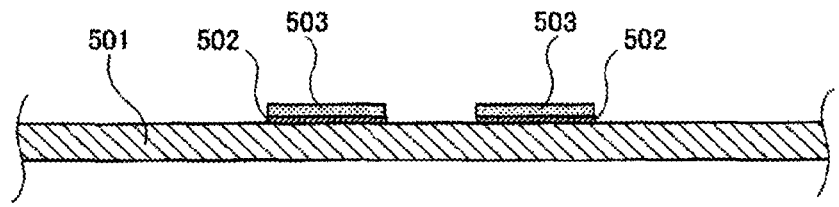
Figure 10C:
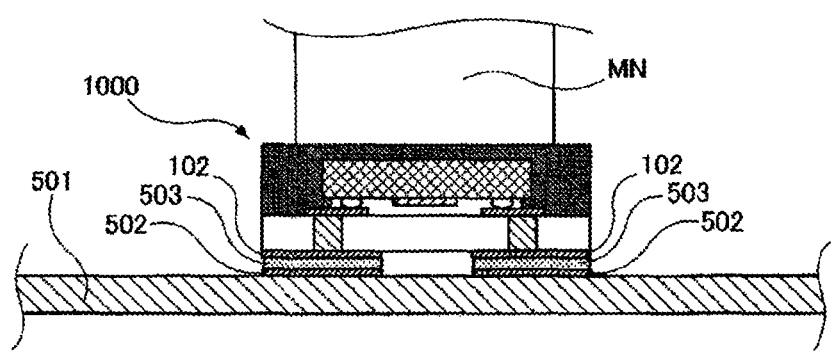
Figure 10D:
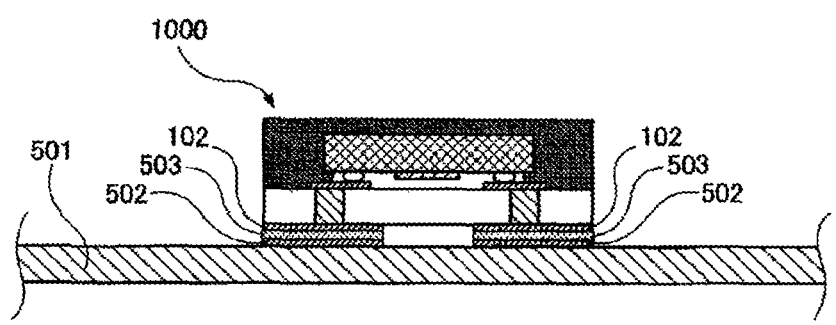
Figure 11A:
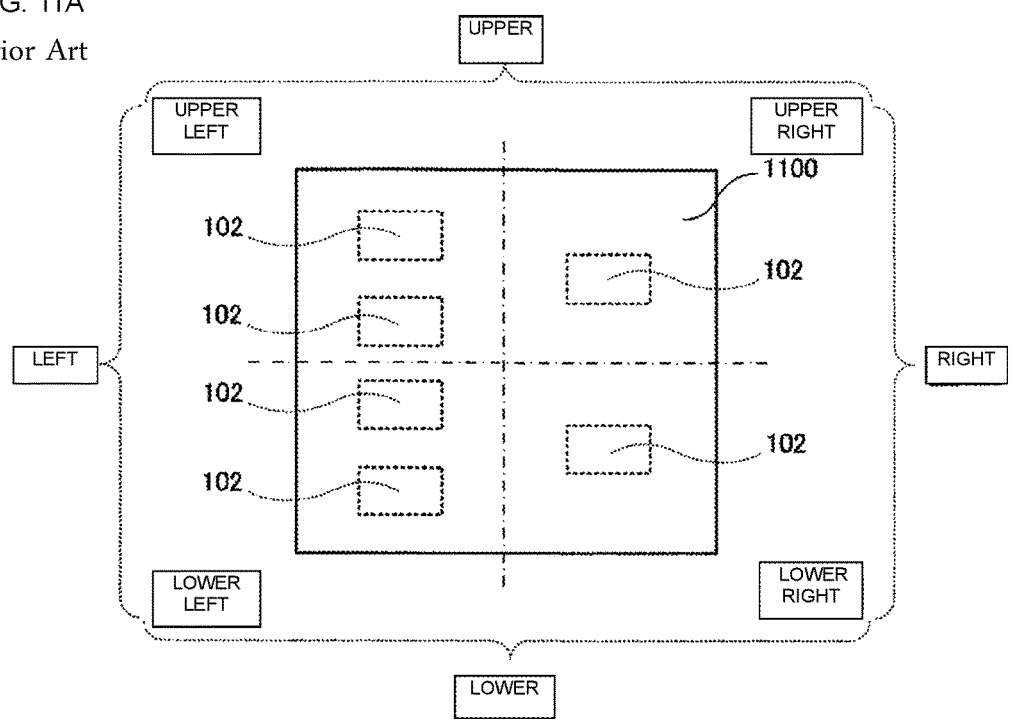
FIG. 11A is a plan view of a conventional electronic component device.
Figure 11B:
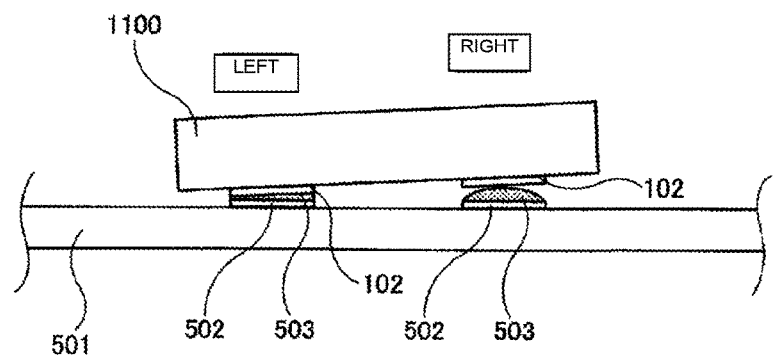
FIG. 11B is a front view illustrating a state in which mounting failure (joining failure) occurs in the conventional electronic component device.
Figure 12A:
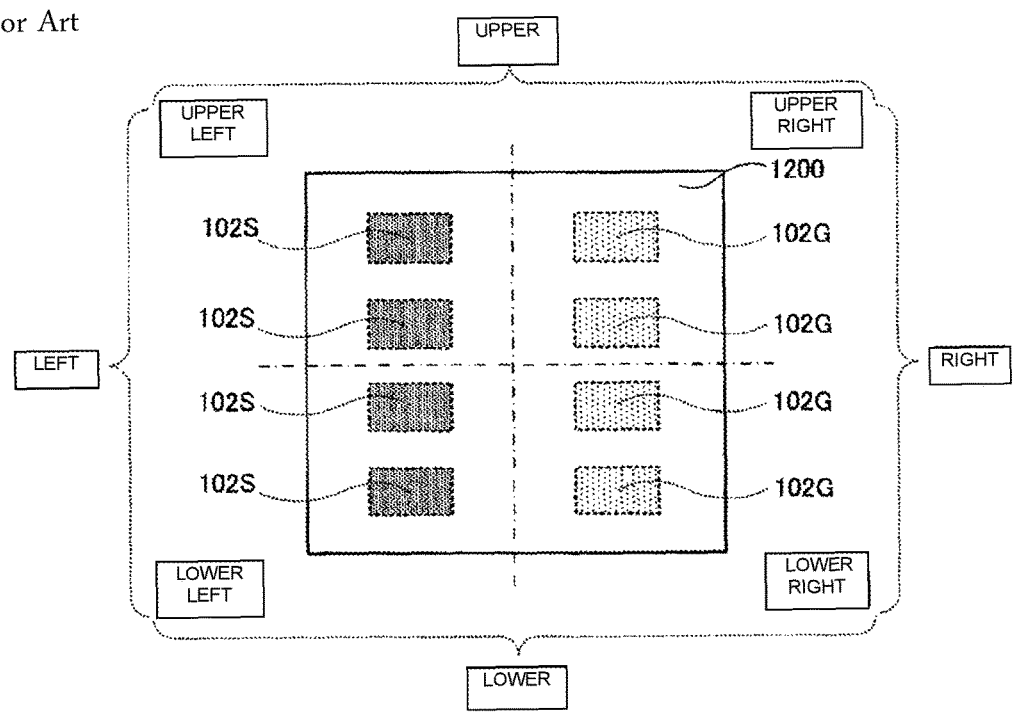
FIG. 12A is a plan view of a conventional electronic component device.
Figure 12B:
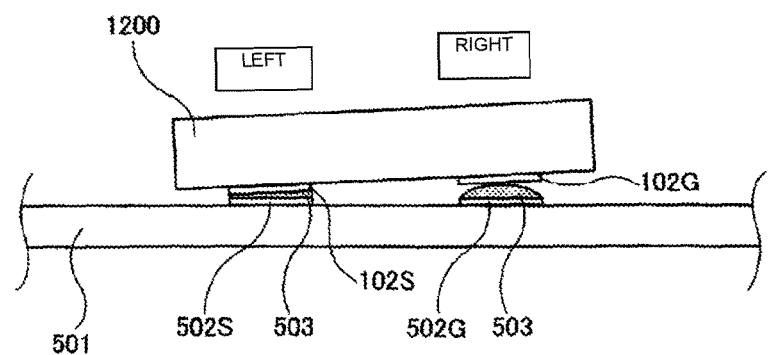
FIG. 12B is a front view illustrating a state in which mounting failure (joining failure) occurs in the conventional electronic component device.

FIGS. 8A and 8B illustrate an electronic component device 700 according to a seventh preferred embodiment of the present invention. FIG. 8A is a sectional view of the electronic component device 700. FIG. 8B is a plan view of the electronic component device 700, and also shows in perspective signal outer electrodes 32S and ground outer electrodes 32G that are provided on a lower principal surface. The sectional view of FIG. 7A shows a portion taken along a dash-dot line X-X in FIG. 7B.

The electronic component device 700 is an electronic component device in which changes have been made in the electronic component device 200 according to the second preferred embodiment.

That is, in the electronic component device 200, four signal outer electrodes 2S and four ground outer electrodes 2G are provided on the lower principal surface of the mount substrate 1, whereas, in the electronic component device 700, as shown in FIG. 8B, four signal outer electrodes 32S and five ground outer electrodes 32G are provided on a lower principal surface of a mount substrate 1. The signal outer electrodes 32S and the ground outer electrodes 32G have the same area. The other structural features of the electronic component device 700 are the same as those of the electronic component device 200.

A specific arrangement of the signal outer electrodes 32S and the ground outer electrodes 32G is as shown in FIG. 8B.

That is, when the types of outer electrodes of the electronic component device 700 are not considered, the formation densities of the outer electrodes are equal to each other. That is, in each of the upper right region, the lower right region, the upper left region, and the lower left region, about 2.25 signal outer electrodes 32S or about 2.25 ground outer electrodes 32G are provided, for example. Therefore, the formation density of the outer electrodes in the upper region and the formation density of the outer electrodes in the lower region are equal to each other, and the formation density of the outer electrodes in the left region and the formation density of the outer electrodes in the right region are equal to each other.

In contrast, the formation density of the ground outer electrodes 32G depends upon the region. More specifically, about 0.75 ground outer electrodes 32G are in the upper left region, for example. About 1.25 ground outer electrodes 32G are provided in the lower left region, for example. About 1.75 ground outer electrodes 32G are provided in the upper right region, for example. About 1.25 ground outer electrodes 32G are provided in the lower right region, for example.

As a result, about 2.50 ground outer electrodes 32G are provided in the upper region, and about 2.50 ground outer electrodes 32G are provided in the lower region, for example, as a result of which the formation densities of the ground outer electrodes 32G in these two regions are equal to each other.

In contrast, about 2.00 ground outer electrodes 32G are in the left region, and about 3.00 ground outer electrodes 32G are in the right region, for example, as a result of which the formation densities of the ground outer electrodes 32G in these two regions are not equal to each other. Accordingly, in the electronic component device 700, as shown in FIG. 8A, a region TA of a sealing resin layer 50 with a large thickness is provided in the right region where the formation density of the ground outer electrodes 32G is high.

Since the region TA of the sealing resin layer 50 with the large thickness is provided in the region that tends to be raised during mounting, the electronic component device 700 according to the seventh preferred embodiment is also able to be reliably mounted on, for example, a circuit board without connection failure.

Other Preferred Embodiments

The electronic component devices 100 to 700 according to the first to the seventh preferred embodiments are described above. However, the present invention is not limited to the contents above, so that various changes may be made in accordance with the teachings of the present invention.

For example, although, in each of the electronic component devices 100 to 700, when viewed in a planar direction, the inclination S preferably extends from one side to the other side opposing the one side, the inclination S may be provided from one apex to the other apex opposing the one apex. For example, when the formation density of the outer electrodes in the upper right region is low, or the formation density of the ground outer electrodes in the upper right region is high, it is possible to provide the region TA of the sealing resin layer with the large thickness in the upper right region and to provide the inclination S from an upper right apex to a lower left apex.

Although each of the electronic component devices 100 to 700 preferably are surface acoustic wave devices, the type of electronic component device is not limited to a surface acoustic wave device, so that other types of electronic component devices may be used.

The top surface of the sealing resin layer of the electronic component device may have any shape, so that various changes may be made. For example, an outer peripheral portion of the top surface may be tapered, the top surface may partly have a protrusion, or the protrusion may be a portion of the sealing resin layer with the large thickness. Alternatively, the top surface may have both a tapering portion and a protrusion.

A metal layer may be provided on an outer surface of the sealing resin layer. In addition, the metal layer may be connected to a ground electrical potential, and shielded.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component device comprising:
   a mount substrate including an outer electrode on one principal surface and a mount electrode on another principal surface;
   at least one substrate component including a terminal electrode on one principal surface, and that is mounted on the mount substrate by the terminal electrode being joined to the mount electrode; and
   a sealing resin layer that is provided on the mount substrate on which the at least one substrate component is mounted; wherein
   the sealing resin layer includes an increased thickness region, and a top surface including an inclination; and
   when viewed in a planar direction:
   the mount substrate includes a region with a reduced formation density of the outer electrode; and
   the region of the sealing resin layer with the increased thickness and the region of the mount substrate with the reduced formation density of the outer electrode overlap each other.

2. An electronic component device comprising:
   a mount substrate including an outer electrode on one principal surface and a mount electrode on another principal surface;
   at least one substrate component including a terminal electrode on one principal surface, and that is mounted on the mount substrate by the terminal electrode being joined to the mount electrode; and
   a sealing resin layer that is provided on the mount substrate on which the at least one substrate component is mounted; wherein
   the sealing resin layer includes an increased thickness region, and a top surface including an inclination;
   a plurality of the outer electrodes are provided;
   the outer electrodes include a signal outer electrode and a ground outer electrode; and
   when viewed in a planar direction:
   the mount substrate includes a region with an increased formation density of the ground outer electrode; and
   the increased thickness region of the sealing resin layer and the region of the mount substrate with the increased formation density of the ground outer electrode overlap each other.

3. The electronic component device according to claim 1, wherein the increased thickness region of the sealing resin layer includes the at least one substrate component provided therein.

4. The electronic component device according to claim 1, wherein the increased thickness region of the sealing resin layer includes one of the at least one substrate component with a thickness that is greater than a thickness of another of the at least one substrate component in the increased thickness region of the sealing resin layer.

5. The electronic component device according to claim 1, wherein
   the sealing resin layer is defined by a molded resin layer; and
   the increased thickness region of the sealing resin is defined by a gap between dies with increased thickness.

6. The electronic component device according to claim 1, wherein the inclination of the top surface of the sealing resin layer is defined by a cut in the top surface of the sealing resin layer.

7. The electronic component device according to claim 2, wherein a number of the ground outer electrodes is greater than a number of the signal outer electrodes.

8. The electronic component device according to claim 1, wherein
   a plurality of the outer electrodes are provided; and
   one of the plurality of outer electrodes has a larger area than an area of another one of the plurality of outer electrodes.

9. The electronic component device according to claim 8, wherein the area of the one of the plurality of outer electrodes is about twice the area of the another one of the plurality of outer electrodes.

10. The electronic component device according to claim 1, wherein
    the at least one substrate component includes a large height component and a small height component; and
    the large height component is located in the increased thickness region and the small height component is located outside of the increased thickness region.

11. The electronic component device according to claim 1, wherein
    the at least one substrate component includes a plurality of substrate components; and
    each of the plurality of substrate components is provided in the increased thickness region.

12. The electronic component device according to claim 7, wherein at least one of the signal outer electrodes is provided in the increased thickness region.

13. The electronic component device according to claim 9, wherein the one of the plurality of outer electrodes is provided outside of the increased thickness region.

14. The electronic component device according to claim 2, wherein the increased thickness region of the sealing resin layer includes the at least one substrate component provided therein.

15. The electronic component device according to claim 2, wherein the increased thickness region of the sealing resin layer includes one of the at least one substrate component with a thickness that is greater than a thickness of another of the at least one substrate component in the increased thickness region of the sealing resin layer.

16. The electronic component device according to claim 2, wherein
    the sealing resin layer is defined by a molded resin layer; and
    the increased thickness region of the sealing resin is defined by a gap between dies with increased thickness.

17. The electronic component device according to claim 2, wherein the inclination of the top surface of the sealing resin layer is defined by a cut in the top surface of the sealing resin layer.

18. The electronic component device according to claim 2, wherein one of the plurality of outer electrodes has a larger area than an area of another one of the plurality of outer electrodes.

19. The electronic component device according to claim 2, wherein
   the at least one substrate component includes a large height component and a small height component; and
   the large height component is located in the increased thickness region and the small height component is located outside of the increased thickness region.

20. The electronic component device according to claim 2, wherein
   the at least one substrate component includes a plurality of substrate components; and
   each of the plurality of substrate components is provided in the increased thickness region.

* * * * *